United States Patent
Dai et al.

(10) Patent No.: US 11,139,176 B2
(45) Date of Patent: Oct. 5, 2021

(54) DIRECT GROWTH METHODS FOR PREPARING DIAMOND-ASSISTED HEAT-DISSIPATION SILICON CARBIDE SUBSTRATES OF GAN-HEMTS

(71) Applicant: HARBIN INSTITUTE OF TECHNOLOGY, Heilongjiang (CN)

(72) Inventors: Bing Dai, Heilongjiang (CN); Jiwen Zhao, Heilongjiang (CN); Jiaqi Zhu, Heilongjiang (CN); Lei Yang, Heilongjiang (CN); Wenxin Cao, Heilongjiang (CN); Kang Liu, Heilongjiang (CN); Jiecai Han, Heilongjiang (CN); Guoyang Shu, Heilongjiang (CN); Ge Gao, Heilongjiang (CN); Kaili Yao, Heilongjiang (CN); Benjian Liu, Heilongjiang (CN)

(73) Assignee: Harbin Institute of Technology, Heilongjiang (CN)

( * ) Notice: Subject to any disclaimer, the term of this patent is extended or adjusted under 35 U.S.C. 154(b) by 100 days.

(21) Appl. No.: 16/800,689

(22) Filed: Feb. 25, 2020

(65) Prior Publication Data
US 2020/0273717 A1    Aug. 27, 2020

(30) Foreign Application Priority Data

Feb. 25, 2019 (CN) .......................... 201910136716.7

(51) Int. Cl.
*H01L 21/48* (2006.01)
*H01L 21/02* (2006.01)

(52) U.S. Cl.
CPC ...... *H01L 21/4803* (2013.01); *H01L 21/0203* (2013.01); *H01L 21/02063* (2013.01); *H01L 21/02378* (2013.01)

(58) Field of Classification Search
CPC ............ H01L 21/4803; H01L 21/0203; H01L 21/02063; H01L 21/02378; H01L 21/3732; H01L 21/02513; H01L 21/02527; H01L 21/02639; H01L 21/0262; H01L 21/0243; H01L 21/02444
See application file for complete search history.

(56) References Cited

U.S. PATENT DOCUMENTS 9,685,513 B2 * 6/2017 Kub ..................... H01L 29/205

* cited by examiner

*Primary Examiner* — Cuong B Nguyen
(74) *Attorney, Agent, or Firm* — Avant Law Group, LLC

(57) ABSTRACT

Direct growth methods for preparing diamond-assisted heat-dissipation silicon carbide substrates of GaN-HEMTs are disclosed. In an embodiment, the direct growth method includes the following steps: (1) etching holes in a surface of a silicon carbide substrate to produce a silicon carbide wafer; (2) ultrasonic cleaning the produced silicon carbide wafer; (3) establishing an auxiliary nucleation point on a surface of the silicon carbide wafer; (4) depositing a diamond layer; (5) removing the portion of the diamond layer on the upper surface while retaining the portion of the diamond layer in the holes; (6) ultrasonic cleaning; and (7) depositing diamond in the holes on the silicon carbide wafer until the holes are fully filled.

10 Claims, 1 Drawing Sheet

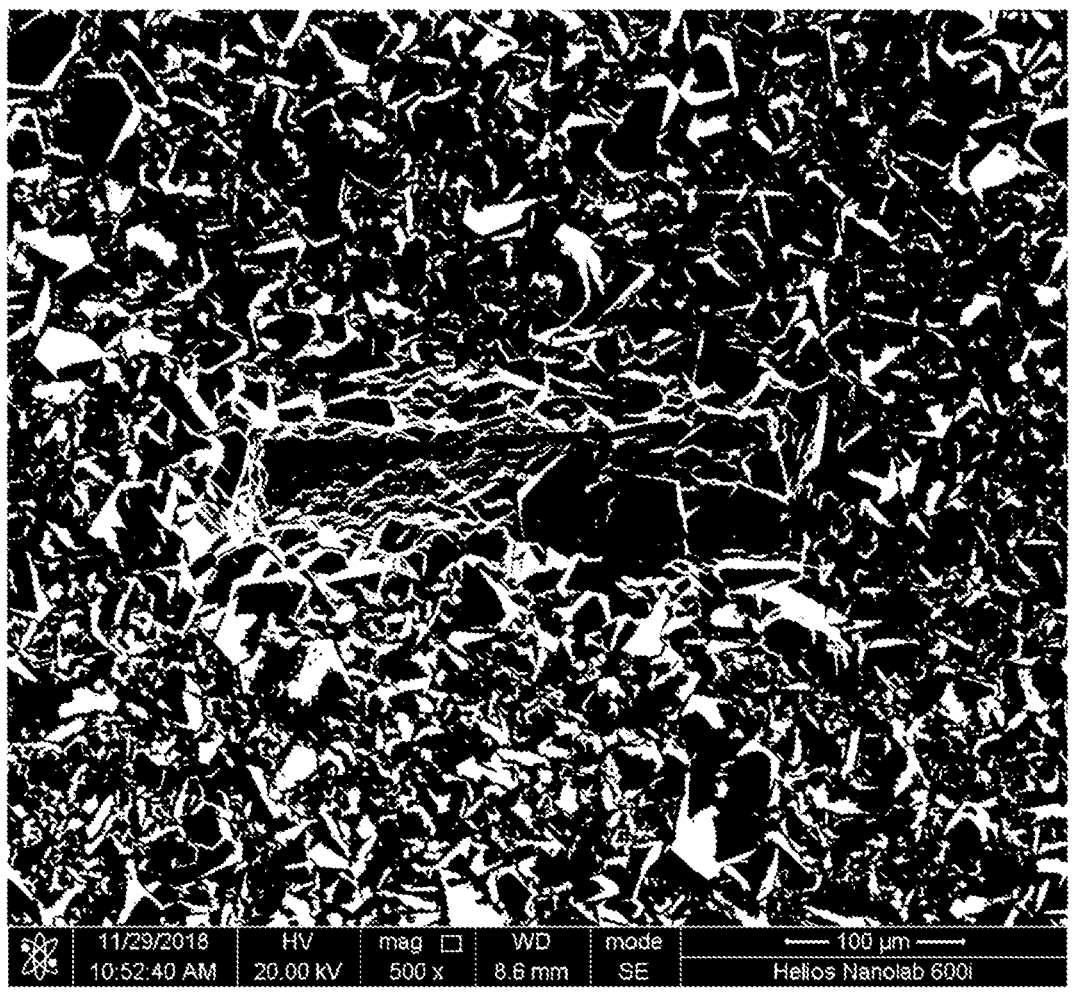

DIRECT GROWTH METHODS FOR PREPARING DIAMOND-ASSISTED HEAT-DISSIPATION SILICON CARBIDE SUBSTRATES OF GAN-HEMTS

CROSS REFERENCE TO RELATED APPLICATIONS

This application claims priority to Chinese application number 20191013671-6.7 filed on Feb. 25, 2019, the disclosure of which is incorporated by reference herein in its entirety.

FIELD OF THE DISCLOSURE

The disclosure relates generally to heat dissipation. More specifically, the disclosure relates to a method for preparing a heat-dissipation structure in which diamond is connected with silicon carbide.

BACKGROUND

Due to their rapid development, the frequency and integration of electronic devices are becoming higher. Thus, the concentration of heat generation is becoming higher, and the influence of the heat generated in the device over the stability of the device cannot be ignored. Therefore, removing heat efficiently and quickly has become the focus of the research in the industry. The demand on thermally conductive materials is especially and increasingly urgent. Thermal conductivity is a key parameter in evaluating the heat conduction performance of materials. The preparation of high thermal conductivity materials is an indispensable part for making progress in electronic devices.

As a representative material of third generation semiconductor materials, Gallium Nitride (GaN) is one of the main materials in preparing various current and further semiconductor devices. However, the thermal conductivity of GaN is only 220 W/(m·K). The current GaN high electron mobility transistors (HEMTs) wafer substrate is generally silicon carbide (SiC), and its thermal conductivity is only about 400 W/(m·K). During the use of semiconductor devices, a large amount of heat is generated, which affects the device operation efficiency. The power density of current GaN devices is below 10 W/mm with an upper limit of about 60 W/mm. As the frequency of electronic devices increases, the problem of heat accumulation will be particularly magnified. Therefore, regarding how to solve the heat dissipation problem of GaN devices, preparing a new type of heat-dissipation structure is the most important.

Diamond has many excellent properties: the thermal conductivity is very high at room temperature, which is up to 2200 W/(m·K); the resistivity is high; and the stability is good. It is an excellent choice as a heat-dissipation material, especially for heat dissipation of gallium nitride high-electron-mobility transistors (GaN-HEMTs). But the preparation process is complex, the production cost is high, and the existing production line structure has to be abandoned.

SUMMARY

The following presents a simplified summary of the invention in order to provide a basic understanding of some aspects of the invention. This summary is not an extensive overview of the invention. It is not intended to identify critical elements or to delineate the scope of the invention. Its sole purpose is to present some concepts of the invention in a simplified form as a prelude to the more detailed description that is presented elsewhere.

In some embodiments, the disclosure provides a direct growth method for preparing diamond-assisted heat dissipation silicon carbide substrates of GaN-HEMTs.

The direct growth method includes the following steps. (1) Etching holes on a surface of a SiC substrate by laser etching or metal plating etching to obtain a SiC wafer containing a hole structure. The holes are located below the GaN-HEMTs and have a depth of 100 to 400 μm. (2) Placing the SiC wafer containing the hole structure sequentially in anhydrous ethanol and deionized water for ultrasonic cleaning to obtain a cleaned SiC wafer containing the hole structure. (3) Spin-coating a nano-diamond suspension on a surface of the cleaned SiC wafer containing the hole structure to obtain a SiC wafer with an establishment of an auxiliary nucleation point. (4) Placing the SiC wafer with the establishment of the auxiliary nucleation point in a microwave plasma-assisted chemical vapor deposition (MPCVD) device to deposit a diamond layer by introducing hydrogen and methane for 1 to 4 h under a hydrogen flow rate of 100 to 300 sccm, a methane flow rate of 5 to 30 sccm, a deposition pressure of 100 to 300 mBar, and a deposition temperature of 700 to 900° C. to obtain a SiC wafer with a diamond nucleation film layer. (5) Polishing the SiC wafer with the diamond nucleation film layer to remove the diamond nucleation film layer on an upper surface while retaining the diamond nucleation film layer in the holes to obtain a SiC wafer with the diamond nucleation film layer in the holes. (6) Placing the SiC wafer with the diamond nucleation film layer in the holes in anhydrous ethanol and deionized water for ultrasonic cleaning to obtain a cleaned SiC wafer with the diamond nucleation film layer in the holes. (7) Placing the cleaned SiC wafer with the diamond nucleation film layer in the holes in the MPCVD device for deposition only in the holes on the SiC wafer by introducing hydrogen and methane under a hydrogen flow rate of 100 to 300 sccm, a methane flow rate of 5 to 30 sccm, a deposition pressure of 100 to 300 mBar, and a deposition temperature of 700 to 900° C. until the holes are filled with the deposition.

BRIEF DESCRIPTION OF THE DRAWING

The FIGURE shows an electron microscope image of a diamond-assisted heat-dissipation silicon carbide substrate of GaN-HEMTs according to an embodiment of the disclosure.

DETAILED DESCRIPTION

The following describes some non-limiting exemplary embodiments of the invention with reference to the accompanying drawing. The described embodiments are merely a part rather than all of the embodiments of the invention. All other embodiments obtained by a person of ordinary skill in the art based on the embodiments of the disclosure shall fall within the scope of the disclosure.

In some embodiments, the direct growth method for preparing the diamond-assisted heat dissipation silicon carbide substrates of GaN-HEMTs may include following steps.

(1) Etching holes on a surface of a SiC substrate by laser etching or metal plating etching to obtain a SiC wafer containing a hole structure. The holes may be located below the GaN-HEMTs and may have a depth of 100 to 400 μm.

(2) Placing the SiC wafer containing the hole structure sequentially in anhydrous ethanol and deionized water for ultrasonic cleaning to obtain a cleaned SiC wafer containing the hole structure.

(3) Spin-coating a nano-diamond suspension on a surface of the cleaned SiC wafer containing the hole structure to obtain a SiC wafer with an establishment of an auxiliary nucleation point.

(4) Placing the SiC wafer with the establishment of the auxiliary nucleation point in an MPCVD device to deposit a diamond layer by introducing hydrogen and methane for 1 to 4 h under a hydrogen flow rate of 100 to 300 sccm, a methane flow rate of 5 to 30 sccm, a deposition pressure of 100 to 300 mBar, and a deposition temperature of 700 to 900° C. to obtain a SiC wafer with a diamond nucleation film layer.

(5) Polishing the SiC wafer with the diamond nucleation film layer to remove the diamond nucleation film layer on an upper surface while retaining the diamond nucleation film layer in the holes to obtain a SiC wafer with the diamond nucleation film layer in the holes.

(6) Placing the SiC wafer with the diamond nucleation film layer in the holes in anhydrous ethanol and deionized water for ultrasonic cleaning to obtain a cleaned SiC wafer with the diamond nucleation film layer in the holes.

(7) Placing the cleaned SiC wafer with the diamond nucleation film layer in the holes in the MPCVD device for deposition only in the holes on the SiC wafer by introducing hydrogen and methane under a hydrogen flow rate of 100 to 300 sccm, a methane flow rate of 5 to 30 sccm, a deposition pressure of 100 to 300 mBar, and a deposition temperature of 700 to 900° C. until the holes are filled with the deposition to complete the preparation of the diamond-assisted heat-dissipation silicon carbide substrate of GaN-HEMTs.

In other embodiments, a GaN-HEMTs device may be positioned on an upper surface of the SiC wafer, and holes may be etched on a lower surface of the SiC wafer.

In further embodiments, in step (5), the diamond film layer on the upper surface may be removed, and the diamond inside the holes may be retained as the "seed" for the second growth of the diamond in step (7), such that the diamond may be grown only inside the holes.

In some embodiments, with respect to the "hot spots" of the device, the diamond heat-dissipation pillars may be arranged under the hot spots using a microwave plasma-assisted chemical vapor deposition (MPCVD) method to quickly dissipate the heat.

Optionally, the length of the holes may be 100 to 300 μm and the width of the holes may be 100 to 300 μm in step (1).

Optionally, the SiC wafer containing the hole structure in step (2) may be sequentially and ultrasonically cleaned in the anhydrous ethanol for fifteen minutes and the deionized water for fifteen minutes.

Optionally, the particle size of the diamond particles in the diamond suspension in step (3) may be 10 to 50 nm.

Optionally, step (3) may be replaced by ultrasonic dispersing the cleaned SiC wafer containing the hole structure in a nano-diamond suspension to obtain a SiC wafer with the establishment of an auxiliary nucleation point.

Optionally, hydrogen and methane may be introduced in step (4) for 2 hours under a hydrogen flow rate of 150 sccm, a methane flow rate of 5 sccm, a deposition pressure of 150 mBar, and a deposition temperature of 800° C.

Optionally, the polishing in step (5) may be a mechanical polishing or a chemically assisted mechanical polishing.

Optionally, the polishing in step (5) may be carried out by a polishing disc at a rotation speed of 1000 to 4000 rpm/min.

Optionally, the SiC wafer having a diamond film layer in the holes in step (6) may be sequentially and ultrasonically cleaned in the anhydrous ethanol for twenty minutes and the deionized water for twenty minutes.

Optionally, hydrogen and methane may be introduced in step (7) under a hydrogen flow rate of 150 sccm, a methane flow rate of 10 sccm, a deposition pressure of 200 mBar, and a deposition temperature of 800° C.

In some embodiments, the direct growth method for preparing the diamond-assisted heat dissipation silicon carbide substrates of GaN-HEMTs may include following steps.

(1) Holes may be etched on the surface of the SiC substrate by metal plating etching to obtain a SiC wafer containing a hole structure. The holes may be located below the GaN-HEMTs, and may have a length of 100 μm, a width of 300 μm, and a depth of 180 μm.

(2) The SiC wafer containing the hole structure may be sequentially placed in anhydrous ethanol and deionized water for ultrasonic cleaning for fifteen minutes to obtain a cleaned SiC wafer containing the hole structure.

(3) The SiC wafer containing the hole structure cleaned in step (2) may be ultrasonically dispersed in a nano-diamond suspension having a nano-diamond particle size of 30 nanometers for thirty minutes to obtain a SiC wafer with the establishment of an auxiliary nucleation point.

(4) The SiC wafer with the establishment of an auxiliary nucleation point may be placed in an MPCVD device to deposit a diamond layer with the introduction of hydrogen and methane for 2 hours to obtain a SiC wafer with a diamond nucleation film layer. The hydrogen flow rate is 150 sccm, the methane flow rate is 5 sccm, the deposition pressure is 150 mBar, and the deposition temperature is 800° C.

(5) The SiC wafer with a diamond nucleation film layer may be mechanically polished to remove the diamond film layer on the upper surface while retaining the diamond film layer in the holes to obtain a SiC wafer with the diamond film layer in the holes. The rotation speed of the polishing disc is controlled to be 3000 rpm/min.

(6) The SiC wafer with the diamond film layer in the holes may be sequentially placed in anhydrous ethanol and deionized water for ultrasonic cleaning for thirty minutes to obtain a cleaned SiC wafer with the diamond film layer in the holes.

(7) The cleaned SiC wafer with the diamond film layer in the holes obtained in step (6) may be placed in the MPCVD device for deposition, which is only performed in the holes on the SiC wafer by introducing hydrogen and methane for 50 hours. The hydrogen flow rate is 150 sccm, the methane flow rate is 10 sccm, the deposition pressure is 150 mBar, and the deposition temperature is 800° C. The holes may be filled with the deposition to complete the preparation of a diamond-assisted heat-dissipation silicon carbide substrate of GaN-HEMTs.

Various embodiments of the disclosure may have one or more of the following effects.

The disclosure may provide a direct growth method for preparing diamond-assisted heat-dissipation silicon carbide substrates of GaN-HEMTs. The prepared heat-dissipation structure may have diamond connected with silicon carbide, which may help to improve the heat-dissipation performance of the existing GaN-HEMTs.

The disclosure may further provide a method for preparing a composite heat-dissipation structure of diamond and SiC substrate, which may help to improve the heat-dissipation performance of the existing GaN-HEMTs.

The disclosure may also provide prepared diamond with high purity and high thermal conductivity. In some examples, the thermal conductive of the prepared diamond may reach 1400 W/(m·K) or even higher as the diamond thickness increases. In other examples, the thermal conductivity of the prepared diamond in the holes of SiC wafers or substrates may be above 1000 W/(m·K). The prepared diamond may have good compatibility, high binding force, and a structure similar to that of SiC. The prepared diamond may be located below the device, and the depth of the hole may be closer to GaN, such that the heat of the hot spots may be quickly guided out.

The disclosure may provide a MPCVD method for preparing a diamond heat-dissipation structure inside a SiC substrate, which may help to solve the heat dissipation problem of SiC-based GaN devices. In the prepared diamond heat-dissipation structure, the heat may be accurately and quickly guided out according to the hot spots of GaN-HEMTs.

The disclosure may further provide a method in which the SiC substrate is retained, such that the existing production line may be used continually without restarting the production line.

It is to be understood that while GaN-HEMTs are used in the disclosure for illustration purpose, a person of ordinary skill in the art would understand that similar methods may be used in other HEMT materials such as gallium arsenide (GaAs), aluminum gallium nitride (AlGaN), aluminum gallium arsenide (AlGaAs), et cetera.

Many different arrangements of the various components depicted, as well as components not shown, are possible without departing from the spirit and scope of the present disclosure. Embodiments of the present disclosure have been described with the intent to be illustrative rather than restrictive. Alternative embodiments will become apparent to those skilled in the art that do not depart from its scope. A skilled artisan may develop alternative means of implementing the aforementioned improvements without departing from the scope of the present disclosure.

It will be understood that certain features and subcombinations are of utility and may be employed without reference to other features and subcombinations and are contemplated within the scope of the claims. Unless indicated otherwise, not all steps listed in the various figures need be carried out in the specific order described.

The disclosure claimed is:

1. A direct growth method for preparing diamond-assisted heat dissipation silicon carbide substrates of GaN-high electron mobility transistors (GaN-HEMTs), comprising the steps of:
   (1) etching holes on a surface of a SiC substrate by laser etching or metal plating etching to obtain a SiC wafer containing a hole structure, wherein the holes are located below the GaN-HEMTs and have a depth of 100 to 400 um;
   (2) placing the SiC wafer containing the hole structure sequentially in anhydrous ethanol and deionized water for ultrasonic cleaning to obtain a cleaned SiC wafer containing the hole structure;
   (3) spin-coating a nano-diamond suspension on a surface of the cleaned SiC wafer containing the hole structure to obtain a SiC wafer with an establishment of an auxiliary nucleation point;
   (4) placing the SiC wafer with the establishment of the auxiliary nucleation point in a microwave plasma-assisted chemical vapor deposition (MPCVD) device to deposit a diamond layer by introducing hydrogen and methane for 1 to 4 hr under a hydrogen flow rate of 100 to 300 sccm, a methane flow rate of 5 to 30 sccm, a deposition pressure of 100 to 300 mBar, and a deposition temperature of 700 to 900° C. to obtain a SiC wafer with a diamond nucleation film layer;
   (5) polishing the SiC wafer with the diamond nucleation film layer to remove the diamond nucleation film layer on an upper surface while retaining the diamond nucleation film layer in the holes to obtain a SiC wafer with the diamond nucleation film layer in the holes;
   (6) placing the SiC wafer with the diamond nucleation film layer in the holes in anhydrous ethanol and deionized water for ultrasonic cleaning to obtain a cleaned SiC wafer with the diamond nucleation film layer in the holes; and
   (7) placing the cleaned SiC wafer with the diamond nucleation film layer in the holes in the MPCVD device for deposition only in the holes on the SiC wafer by introducing hydrogen and methane under a hydrogen flow rate of 100 to 300 sccm, a methane flow rate of 5 to 30 sccm, a deposition pressure of 100 to 300 mBar, and a deposition temperature of 700 to 900° C. until the holes are filled with the deposition.

2. The direct growth method in claim 1, wherein the holes in step (1) have a length of 100 to 300 μm and a width of 100 to 300 μm.

3. The direct growth method in claim 1, wherein the SiC wafer containing the hole structure in step (2) is sequentially and ultrasonically cleaned in the anhydrous ethanol for fifteen minutes and the deionized water for fifteen minutes.

4. The direct growth method in claim 1, wherein the nano-diamond suspension in step (3) contains nano-diamond particles sized between 10 to 50 nm.

5. The direct growth method in claim 1, wherein step (3) is replaced by ultrasonic dispersing the cleaned SiC wafer containing the hole structure in a nano-diamond suspension to obtain a SiC wafer with an establishment of an auxiliary nucleation point.

6. The direct growth method in claim 1, wherein, in step (4), hydrogen and methane are introduced for 2 hours under a hydrogen flow rate of 150 sccm, a methane flow rate of 5 sccm, a deposition pressure of 150 mBar, and a deposition temperature of 800° C.

7. The direct growth method in claim 1, wherein the polishing in step (5) is a mechanical polishing or a chemically assisted mechanical polishing.

8. The direct growth method in claim 1, wherein the polishing in step (5) is carried out by a polishing disc at a rotation speed of 1000 to 4000 rpm/min.

9. The direct growth method in claim 1, wherein the SiC wafer having a diamond nucleation film layer in the holes in step (6) is sequentially and ultrasonically cleaned in the anhydrous ethanol for twenty minutes and the deionized water for twenty minutes.

10. The direct growth method in claim 1, wherein, in step (7), hydrogen and methane are introduced under a hydrogen flow rate of 150 sccm, a methane flow rate of 10 sccm, a deposition pressure of 200 mBar, and a deposition temperature of 800° C.

* * * * *